(12) United States Patent
Berger et al.

(10) Patent No.: US 11,365,063 B2
(45) Date of Patent: Jun. 21, 2022

(54) SUPPLY DEVICE, RETROFIT KIT FOR A VIBRATION FEEDER AS WELL AS A MANUFACTURING METHOD AND AN OPERATION METHOD FOR THE SUPPLY DEVICE

(71) Applicant: Böllhoff Verbindungstechnik GmbH, Bielefeld (DE)

(72) Inventors: Nadja Berger, Bielefeld (DE); Wilhelm Westermann, Bielefeld (DE); Matthias Vornheder, Rödinghausen (DE); Torsten Draht, Schloß Holte-Stukenbrock (DE)

(73) Assignee: Böllhoff Verbindungstechnik GmbH, Bielefeld (DE)

( * ) Notice: Subject to any disclaimer, the term of this patent is extended or adjusted under 35 U.S.C. 154(b) by 0 days.

(21) Appl. No.: 17/161,301

(22) Filed: Jan. 28, 2021

(65) Prior Publication Data
US 2021/0237984 A1   Aug. 5, 2021

(30) Foreign Application Priority Data

Feb. 3, 2020  (EP) ..................... 20155166

(51) Int. Cl.
*B65G 47/20* (2006.01)
*B65G 3/04* (2006.01)
(Continued)

(52) U.S. Cl.
CPC ............... *B65G 47/20* (2013.01); *B65G 3/04* (2013.01); *B65G 65/40* (2013.01); *B65G 47/1421* (2013.01); *B65G 2812/0312* (2013.01)

(58) Field of Classification Search
CPC ........ B65G 65/40; B65G 65/44; B65G 47/18; B65G 47/19; B65G 47/20; B65G 47/1421; B65G 47/145; B65G 47/1457
See application file for complete search history.

(56) References Cited

U.S. PATENT DOCUMENTS 2,065,319 A   12/1936   Lewis
2,770,352 A * 11/1956   Moller ............... B65G 47/1421
                                                   198/391
(Continued)

FOREIGN PATENT DOCUMENTS

CN       1053039 A       7/1991
DE    102007016691 A1   10/2008
(Continued)

OTHER PUBLICATIONS

CN Office Action for CN Application No. 202110150139.4 dated Mar. 29, 2022 (22 pages).

*Primary Examiner* — William R Harp
(74) *Attorney, Agent, or Firm* — Reising Ethington P.C.; Matthew J. Schmidt

(57) ABSTRACT

A supply device with which elements in disordered form, in particular connection elements as bulk elements, are suppliable to a second receiving volume. The supply device includes a first receiving container from which, via an outlet opening, a plurality of elements is deliverable to a second receiving container. The second receiving container may consist of an oscillation feeder. The oscillation energy of the oscillation feeder is specifically transmitted onto the elements, which are stored in the first receiving container. With the help of the transmitted oscillations, elements are transferred from the first receiving container via a transfer zone from the first receiving container into the second receiving container.

20 Claims, 8 Drawing Sheets

(51) Int. Cl.
*B65G 65/40* (2006.01)
*B65G 47/14* (2006.01)

(56) References Cited

U.S. PATENT DOCUMENTS

| | | | |
|---|---|---|---|
| 2,774,519 A | | 12/1956 | Aldred |
| 2,896,824 A | | 7/1959 | Sheldon |
| 3,305,067 A | | 2/1967 | Mayer |
| 4,092,990 A | * | 6/1978 | Bayne .................. G07D 1/00 221/10 |
| 4,239,103 A | * | 12/1980 | Feldpausch ............ B65G 27/02 198/391 |
| 5,065,852 A | | 11/1991 | Marti |
| 6,631,799 B2 | * | 10/2003 | Samson ................. B65G 27/04 198/443 |
| 8,386,275 B2 | * | 2/2013 | Chambers ............... G07F 11/44 705/2 |
| 8,452,446 B1 | * | 5/2013 | Madris ................. A61J 7/0084 700/236 |
| 2010/0140287 A1 | | 6/2010 | Richardson et al. |
| 2011/0121013 A1 | | 5/2011 | Delattre |
| 2012/0257951 A1 | | 10/2012 | Arnone et al. |

FOREIGN PATENT DOCUMENTS

| | | |
|---|---|---|
| EP | 2331434 B1 | 6/2012 |
| GB | 1074630 A | 7/1967 |
| JP | S58104812 A | 6/1983 |
| JP | 2001287826 A | 10/2001 |
| JP | 2015063370 A | 4/2015 |
| KR | 20060133935 A | 12/2006 |
| KR | 100769711 B1 | 10/2007 |
| KR | 1020120121523 A | 11/2012 |
| KR | 101309643 B1 | 9/2013 |

\* cited by examiner

SUPPLY DEVICE, RETROFIT KIT FOR A VIBRATION FEEDER AS WELL AS A MANUFACTURING METHOD AND AN OPERATION METHOD FOR THE SUPPLY DEVICE

CROSS REFERENCE TO RELATED APPLICATIONS

This application claims the priority of European patent application No. EP20155166.0, filed on Feb. 3, 2020. The entire content of this priority application is incorporated herein by reference in its entirety.

TECHNICAL FIELD

The present disclosure is related to a supply device with which elements in disordered form, in particular connection elements as bulk goods, are suppliable to a receiving volume. Furthermore, the present application relates to a retrofit kit for a vibration feeder so that elements in disordered form, in particular connection elements as bulk goods, are suppliable to a second receiving volume that is formed by the vibration feeder. Moreover, the present application describes a manufacturing method for such a supply device as well as a supply method for a plurality of disordered elements, in particular connection elements as bulk goods, with the help of the supply device.

BACKGROUND

In the state of the art, connection elements are processed in an automated way. These connection elements include, for example, semi-hollow self-piercing rivets, full or solid self-piercing rivets, thread bolts, nails, shooting or pop bolts, blind rivet nuts, insert nuts and similar constructions with which several layers of components are connectable with each other.

Before these connection elements are processed by, for example, a setting device for self-piercing rivets or a setting device for blind rivet nuts, they are supplied to the processing setting device as bulk goods via a supply device. In this connection, the supply device generally ensures that in the course of the supply way, connection elements are separated or individualized from the connection elements which are present as bulk goods, so that they can then be processed individually by the setting device for the establishing of a connection.

For such supply devices, different constructions and thus associated processing principles are known in the state of the art.

In JP 2015-063370 A, US 2012/0257951 A1 and in JP 2001 287 826 A, a wheel regulates the number of elements that are discharged at the outlet opening of a receiving container.

KR 10-130 9643 uses an adjustable locking element within the receiving container of the connection elements. The locking element decreases or increases an opening through which the connection elements or elements, respectively, fall due to their gravity, i.e. gravity-driven.

In documents KR 10-2012-0121523, EP 2 331 434 B1, DE 10 2007 016 691 A1 as well as U.S. Pat. No. 2,774,519, a movable door closes the outlet opening of the receiving container. Accordingly, the number of elements that are discharged by the receiving container can be adjusted by means of the size of the opening of the outlet opening.

In U.S. Pat. No. 2,065,319, the outlet opening of a funnel-shaped receiving container with elements is limited and blocked by a type of a bowl. Accordingly, due to the dynamic pressure of the elements, they accumulate at a transfer gap which is present between the funnel-shaped container and the bowl. Due to a step in the bowl, the elements are not pressed in an unhindered way out of the funnel-shaped receiving container into the bowl. Rather, the elements which have accumulated at the bowl are discharged evenly in a limited number through a stripping mechanism. This stripping mechanism moves past the accumulated elements on the bowl. As the stripping mechanism rotates about the funnel-shaped receiving container and in this way, is moved past in a regular stripping movement at the accumulated elements, the elements are continuously discharged from the accumulated portion between the receiving container and the bowl.

According to the supply device described in U.S. Pat. No. 2,896,824, a receiving container serves for storing elements as bulk goods. The outlet opening at the bottom of the receiving container is closed by a plate which extends radially beyond the outer wall of the receiving container. As there is a transfer gap between the plate and the adjacent edge of the receiving container, the elements which have accumulated in the receiving container can get out of the receiving container onto the plate through the transfer gap. In order to support the transfer of the elements from the receiving container to the plate, the receiving container and the plate are rotated jointly via a joint rotation axis. Accordingly, active centrifugal forces support the transfer of the elements through the transfer gap between the receiving container and the plate. The elements are then discharged at a controlled number from the rotating plate with the help of a brush arrangement.

The constructions of supply devices which are known in the state of the art and the supply methods realized therewith are most of the time adjusted to certain element geometries. Therefore, they cannot automatically be transferred to other element geometries.

It is therefore the object of at least some implementations of the present disclosure to suggest an alternative supply device for elements, which may be suitable for the processing of connection elements, such as self-piercing rivets, blind rivet nuts, bolts and the like and which guarantee the supply of connection elements as bulk goods first and then at a reduced number.

SUMMARY

The above object is solved by a supply device with which elements can be supplied in a disordered form, in particular connection elements as bulk goods, to a second receiving volume. A further solution of the above object is a retrofit kit for a vibration feeder, with which elements in disordered form, in particular connection elements as bulk goods, can be supplied to a second receiving volume formed by the vibration feeder. Furthermore, a manufacturing method for the above supply device as well as a supply method for a number of disordered elements with the help of the above-mentioned supply device also constitutes a solution of the object raised above. Advantageous designs and further embodiments are set forth in the dependent claims, the subsequent description as well as the accompanying drawings.

With the supply device, elements in disordered form, in particular connection elements as bulk goods, are suppliable to a second receiving volume. The supply device has the following features: a first receiving container which, may be a first circumferential outer wall, defines a first receiving volume for the disordered elements which is fillable via a first supply opening, may be in the first receiving container and drainable via a first outlet opening, may be in the first receiving container, a second receiving container which, may be a second circumferential outer wall, defines the second receiving volume, wherein the first receiving container with the first receiving volume is arranged at least partly within the second receiving volume, a bottom of the second receiving container is positioned at a distance to the first outlet opening such that the bottom limits the first receiving volume and a transfer zone is present for disordered elements from the first receiving container into the second receiving container, and wherein at least the bottom, in particular an inner wall, of the second receiving container with regard to the first receiving container is movable such that the disordered elements are dischargeable from the first receiving volume of the first receiving container into the second receiving volume of the second receiving container by means of the movement of the bottom.

The present disclosure changes the automatic dosing of the elements to be supplied in order to facilitate the supply process. For this purpose, a stepwise and/or continuous supply of the elements to, a vibration feeder or a vibration spiral feeder is used instead of transferring the complete amount of elements in one step to the vibration feeder.

While the vibration feeder, in particular the vibration spiral feeder, constitutes a second receiving container for the elements as bulk goods, a first receiving container is provided as an upstream supply step within or adjacent to the second receiving container. The first receiving container also contains a first receiving volume that is filled with elements, this number of elements is, however, only transferable in a controlled manner by a transfer zone from the first receiving container into the second receiving container. Therefore, the amount of elements which is to be received and processed by the second receiving container, may be a vibration spiral feeder, can be dosed and is most of the time smaller than in the state of the art. In this way, however, it is not the processing rate of the second receiving container that is reduced, which comprises and is supposed to guarantee a discharging of a certain amount of elements from the second receiving container, in particular the vibration spiral feeder.

Furthermore, this controlled supply of elements is connected with less noise pollution by the supply device. Because the first receiving container may serve as an element storage from which elements can be discharged evenly to the second receiving container. Accordingly, it is not necessary to pour larger amounts of elements into the second receiving container at regular intervals.

Furthermore, the reduced or dosed, respectively, transfer amount of disordered elements from the first receiving container to the second receiving container causes a reduced effort in terms of supervision and control. As a result, fewer sensors in combination with a simple supply construction can be used.

Because the present disclosure uses an immovably arranged first receiving container for storing elements with respect to the second receiving container. With its bottom or generally its inner wall, the second receiving container limits the element storage in the first receiving volume of the first receiving container and thus the first receiving volume itself, a movement of the second receiving container relative to the first receiving volume and the elements contained therein can be used for discharging a controlled number of elements from the first receiving container into the second receiving container. In this connection, the first receiving volume may be defined and limited by the first circumferential outer wall and the bottom or generally the inner wall of the second receiving container. This also applies when there is a distance between the bottom and the adjacent edge of the circumferential outer wall of the first receiving container. Besides the movement of the second receiving container that is decoupled from the first receiving container, a targeted dimensioning or constructive passage design for elements of the transfer zone controls a number of elements that are transferred between the receiving containers.

According to a further design of the supply device, the bottom or generally the inner wall of the second receiving container is puttable into oscillations or vibrations by means of a drive in order to discharge the disordered elements out of the first receiving container.

As has already been described above, the second receiving container limits the first receiving volume of elements in the first receiving container. In this way, on the one hand, the transfer zone of the disordered elements between the first and the second receiving container nay be first of all determined. Furthermore, the limitation of the first receiving volume by the bottom of the second receiving container allows a transfer of a movement of the bottom onto the elements that are stored in the first receiving volume. According to a further embodiment, an oscillation or vibration of the bottom is used as a supply support for the elements which are stored in the first receiving container, this vibration or generally this movement of the bottom or generally of the inner wall of the second receiving container in combination with the dynamic pressure of the disordered elements within the first receiving volume leads to a dosed transfer of elements through the transfer zone from the first receiving container into the second receiving container. Besides a vibration for example by the use of a known vibration feeder, an oscillatory movement or a rotation movement may be transferred onto the bottom or generally the inner wall of the second receiving container in order to discharge elements from the receiving container.

According to a further design of the supply device, the disordered elements are driven by gravity in the first receiving container, particularly passively, or are transported to the first outlet opening by an inner active drive means in the first receiving container.

The construction that the simplest structure of the first receiving container consists of an essentially cylindrically or otherwise formed circumferential outer wall. The first receiving volume of disordered elements is storable within this outwardly limiting outer wall. Provided that the first receiving container comprises an approximately vertical alignment, the acting force of gravity or acting gravitation of the elements moves the amount of disordered elements from the first supply opening into the direction of the first outlet opening. If, however, the first receiving container only has an inclined or any other alignment or irregular shape due to, for example, limited space, the disordered elements are movable into the direction of the first outlet opening by means of an inner transport means, too. For this purpose, an inner engine-driven impeller or belt conveyor is for example useable.

According to a further design of the supply device, the outer wall of the first receiving container includes at least one lateral cutout, adjacent to the outlet opening, which defines the transfer zone.

Due to the adjacent arrangement of the first receiving container, in particular of the first outlet opening, to the second receiving container, the latter limits with the bottom and/or its inner wall the first receiving volume with a certain amount of disordered elements. In order to control the number of disordered elements which are released from the first receiving volume to the second receiving volume of the second receiving container, a lateral cutout is provided adjacent to the outlet opening in the first receiving container. The size of the cutout is chosen such that despite a possible dynamic pressure of the disordered elements in the first receiving container, only a controlled number of disordered elements can leave the first receiving volume into the second receiving container.

With regard to the previously described design of the supply device, the bottom or the inner wall of the second receiving container may be arranged at a distance to the outlet opening, in particular its edge, of the first receiving container such that disordered elements are discharged through the lateral cutout but not through a gap between the first outer wall of the first receiving container and the bottom or the inner wall of the second receiving container.

Due to the specific spacing of the edge of the circumferential outer wall of the first receiving container to at least the bottom of the second receiving container, it may be guaranteed that the disordered elements can leave the first outer volume only through the lateral cutout. This opens up the possibility that by means of the dimensioning and also by the arrangement of the lateral cutout, the number of delivered or transferred disordered elements and the supply device of the disordered elements to the second receiving container can be determined.

In this connection, the lateral cutout of the supply device covers an opening angle range of 90° to 180° with respect to a central longitudinal axis of the first receiving container. The angle range of the cutout may be limited to 60°, 70° or 80°. Furthermore, the construction of the supply device also opens up the possibility to provide a plurality of lateral cutouts for the transfer of disordered elements from the first receiving volume to the second receiving container. In this connection, the one or the plurality of lateral cutouts may be adjusted with present supply ways of the second receiving container for the further transport of the disordered elements.

According to a further design of the supply device, the lateral cutout is at least partly blocked by a flexible retention device, in particular a flexible brush arrangement or an elastic hose or a curtain, whereby the disordered elements are supplied in the transfer zone at a decelerated movement from the first receiving container to the second receiving container.

According to a further embodiment, it is the dimensioning of the lateral cutout alone which decides about the number of disordered elements that are delivered from the first receiving volume to the second receiving container. Besides the dimensioning of the lateral cutout, the lateral cutout may be blocked by the flexible retention device, in particular by the flexible bristles of a brush arrangement according to one embodiment. This retention device acts similarly to a curtain or a surmountable barrier through which the disordered elements are movable so that the disordered elements can surmount the flexible retention device. In this connection, the flexible retention device may form a brake for the number of disordered elements which are intended to be delivered from the first receiving container to the second receiving container. Accordingly, the construction of the flexible retention device, which may be a number of bristles of the flexible brush arrangement, determines the number of disordered elements due to its transmittance or transmitting degree which are transferable from the first receiving volume into the second receiving container. For the passage rate of the flexible retention device, the density of the bristles of the brush arrangement which close the lateral cutout, the flexibility of the bristles of the brush arrangement, the chosen material of the brush arrangement and the interconnected friction between the disordered elements and the brush arrangement are, for example, decisive. This design of features is analogously transferable to other alternatives of the flexible retention device.

According to a further design of the supply device, the flexible retention device is arranged in an adjustable manner regarding its position with respect to the lateral cutout of the first receiving container in order to change a size of a covering of the lateral cutout by the flexible retention device.

Due to the changeable positioning of the flexible retention device, the lateral cutout can be divided into a passage portion without any interference by the flexible retention device and a further passage portion with an interference by the flexible retention device. The flexible retention device may cover the complete lateral cutout, wherein the elements can, however, surmount or pass the retention device in a slowed-down manner. Depending on the positioning of the lateral retention device, the passage rate of the lateral cutout can be adjusted for the disordered elements from the first receiving volume into the second receiving container.

According to a further design of the supply device, a first circumferential outer wall of the first receiving container is approximately circumferentially evenly spaced at the first outlet opening with respect to the bottom and/or the inner wall of the second receiving container, whereby a transfer gap for disordered elements from the first receiving container into the second receiving container is determined.

In contrast to the above-described lateral cutout for transferring disordered elements from the first receiving volume to the second receiving container, the transfer zone is defined as a circumferential transfer gap between the first receiving container and the second receiving container. Accordingly, the lower edge of the first receiving container be spaced as far from the bottom or the inner wall of the second receiving container that at least one layer of disordered elements can pass this transfer gap into the direction of the second receiving container or the distance is smaller than the double maximum measurement or size of an element. The transfer gap may be chosen larger in order to thereby adjust the number of transferred disordered elements from the first receiving container to the second receiving container.

According to a further design of the supply device, the transfer gap has a width so that only one layer of disordered elements can be discharged from the first receiving container through the transfer gap into the second receiving container.

According to a further design of the supply device, the first receiving container has an essentially cylindrical shape and the second receiving container is formed by a vibration feeder, which may be a vibration spiral feeder. The first receiving container may be constructed quadrangularly or polygonally as long as the disordered elements in the first receiving volume are not hindered in their processing or delivery to the second receiving container.

According to a further design of the supply device, the first receiving container is arranged centrally or coaxially to the second receiving container, which may be the vibration feeder.

It has proven advantageous when based on the central or coaxial arrangement, the disordered elements are transferred from the first receiving container to the second receiving container. In this way, delivery ways of the disordered elements are shortened and thus, the cycle time for the supply of individual elements to the final processing location is decreased.

Furthermore, the present disclosure includes a retrofit kit for a vibration feeder or a vibration spiral feeder so that element in disordered from, in particular connection elements as bulk goods, are supplyable to a second receiving volume formed by the vibration feeder. The retrofit kit includes the following features: a first receiving container which defines a first receiving volume for the disordered elements, with the first receiving volume being fillable via a first supply opening in the first receiving container and being dischargeable via a first outlet opening in the first receiving container, a frame construction at which the first receiving container is fastenable so that the first receiving container with the first receiving volume is at least partially arrangeable in the second receiving volume of the vibration feeder so that a bottom and/or an inner wall of the second receiving container is positioned to the first outlet opening at a distance such that the bottom and/or inner wall of the first receiving volume comprises a transfer zone for disordered elements from the first receiving container into the vibration feeder and wherein at least the bottom and/or the inner wall of the vibration feeder is movable with respect to the first receiving container such that the disordered elements can be discharged from the first receiving volume of the first receiving container into the second receiving volume of the vibration feeder by the moving of the bottom and/or the inner wall.

The retrofit kit for a vibration feeder opens up the possibility to realize the above described constructive features and advantages of the supply device by means of a known vibration feeder or vibration spiral feeder. Accordingly, the known vibration feeder as a second receiving container is equipped with an additional first receiving container which is arranged with respect to the vibration feeder in a decoupled way in terms of movement. The first receiving container serves for receiving an amount of elements in disordered form in order to discharge it in a dosed manner from the first receiving container via the transfer zone to the vibration feeder, supported by the movement of the vibration feeder. Based on the frame construction, the movement-decoupled first receiving container for a certain amount of disordered connection elements is positionable in known vibration feeders. This guarantees the realizing of constructive specific features and advantages with respect to the supply device by the combination of a known vibration feeder with the retrofit kit.

Accordingly, a first circumferential outer wall of the first receiving container includes at least one lateral cutout adjacent to the container's outlet opening which defines the transfer zone.

According to a further design of the retrofit kit, the lateral cutout covers an angle range from 90° to 180° with respect to a central longitudinal axis of the first receiving container. The angle range may be limited to a cutout of 50° or 60° or 70° or 80°. A plurality of lateral cutouts may be provided in the first outer wall of the first receiving container.

According to further designs, the first circumferential outer wall of the first receiving container has an essentially cylindrical form. Furthermore, the first receiving container may be arrangeable coaxially with respect to the second receiving container of the vibration feeder.

According to a further design of the retrofit kit, the lateral cutout is blocked by a flexible retention device, such as a flexible brush arrangement or an elastic hose or a curtain, whereby in the transfer zone, the disordered elements are supplied from the first receiving container to the second receiving container in a decelerated movement compared with an element movement without flexible retention device. According to a further design of the retrofit kit, the flexible retention device is arranged in a position-adjustable manner with respect to the lateral cutout or a plurality of lateral cutouts of the first receiving container in order to be able to change a size of a covering of the respective lateral cutout by the flexible retention device With regard to the constructive and the functional design of the flexible retention device or brush arrangement in combination with the lateral cutout of the first outer wall of the first receiving container, reference is made to the description already provided above. The same applies to the described retrofit kit.

According to a further design of the retrofit kit, the first receiving container has a cylindrical form and is arranged centrally or coaxially in the vibration feeder according to a further design. In this embodiment, the central longitudinal axes of the first receiving container and the second receiving container lie on a continuous line. A rotation axis of the essentially cylindrically formed first receiving container may be arranged coaxially with respect to a rotation axis of the second receiving container in form of the vibration feeder or vibration spiral feeder.

The present disclosure furthermore includes a manufacturing method for a supply device as described above in various embodiments. The manufacturing method of the supply device comprises the following steps: providing a vibration feeder, providing a frame construction at least above the vibration feeder and fastening a first receiving container at the frame construction which defines a first receiving volume for the disordered elements by means of a first circumferential outer wall, with the first receiving volume being fillable via a first supply opening in the first receiving container and drainable via a first outlet opening in the first receiving container so that there is a transfer zone for disordered elements from the first receiving container into the second receiving container.

The present disclosure furthermore includes a supply method for a plurality of disordered elements, in particular connection elements as bulk goods with the help of the above-described designs of the supply device. The supply method includes the following steps: supplying a plurality of disordered elements into the first receiving volume of the first receiving container, moving the second inner wall of the second receiving container with respect to the first receiving container, oscillating or vibrating of the second inner wall, and discharging of disordered elements from the first receiving container via the transfer zone into the second receiving volume of the second receiving container.

With the help of the constructive special features of the supply device which have already been described above, a controlled number of disordered elements of the first receiving volume may be discharged from this first receiving volume into the second receiving container, a vibration feeder. In this connection, oscillations or vibrations in combination with the dynamic pressure of the disordered elements in the first receiving container are used in order to discharge a controlled number of the disordered elements through the transfer zone to the vibration feeder.

In order to control the number of elements which are transferred from the first receiving container to the second receiving container, a brush arrangement which at least partially closes a lateral cutout of the first receiving container may be relocated or displaced. Furthermore, to relocate the first receiving container with respect to the second inner wall of the second receiving container such that a transfer gap between the first and the second receiving container is defined.

BRIEF DESCRIPTION OF THE DRAWINGS

The present disclosure will be described in more detail with reference to the accompanying drawings. It shows.

DETAILED DESCRIPTION

Figure 1:
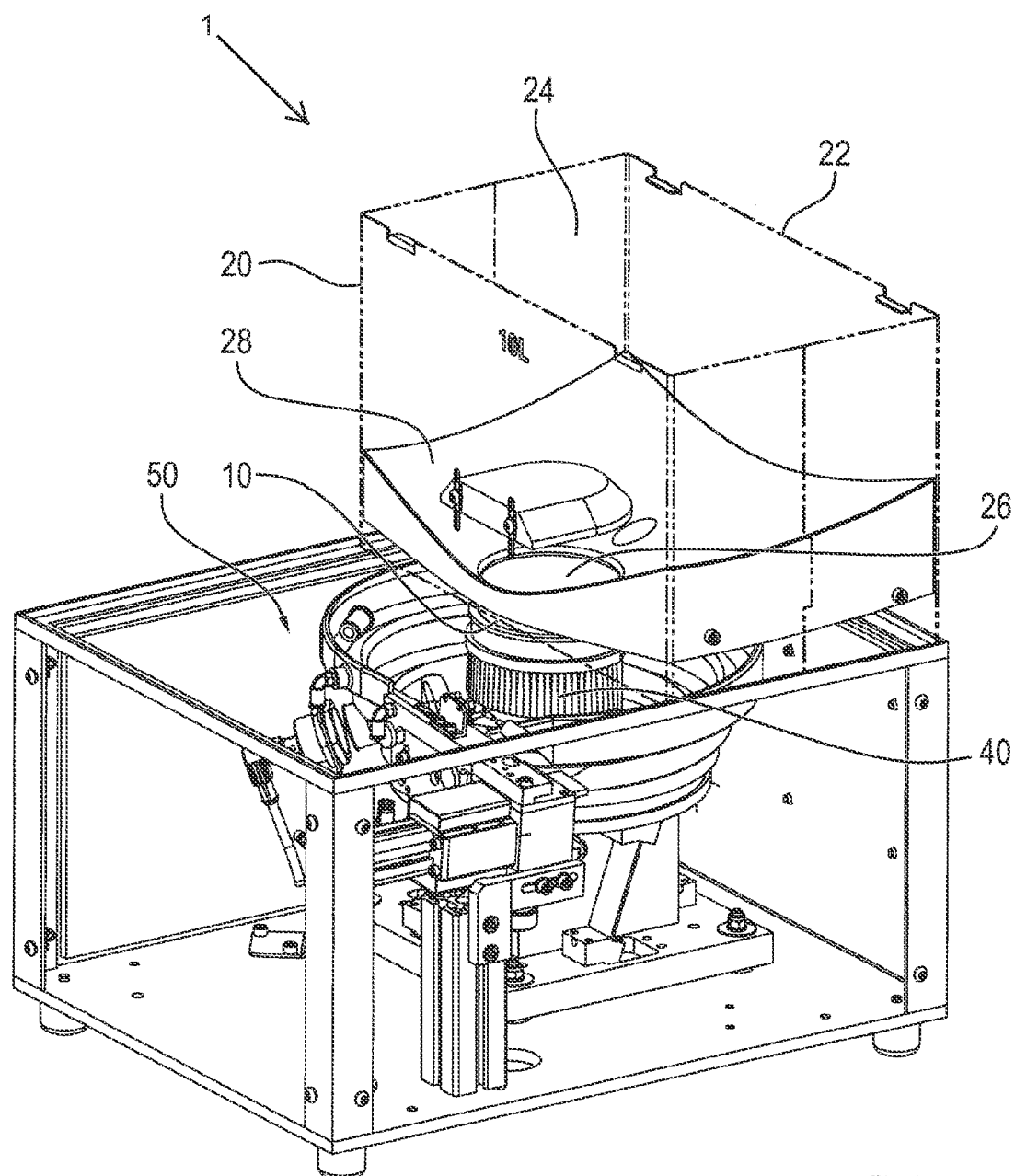
FIG. 1 an embodiment of the supply device with a vibration feeder.
Figure 2:
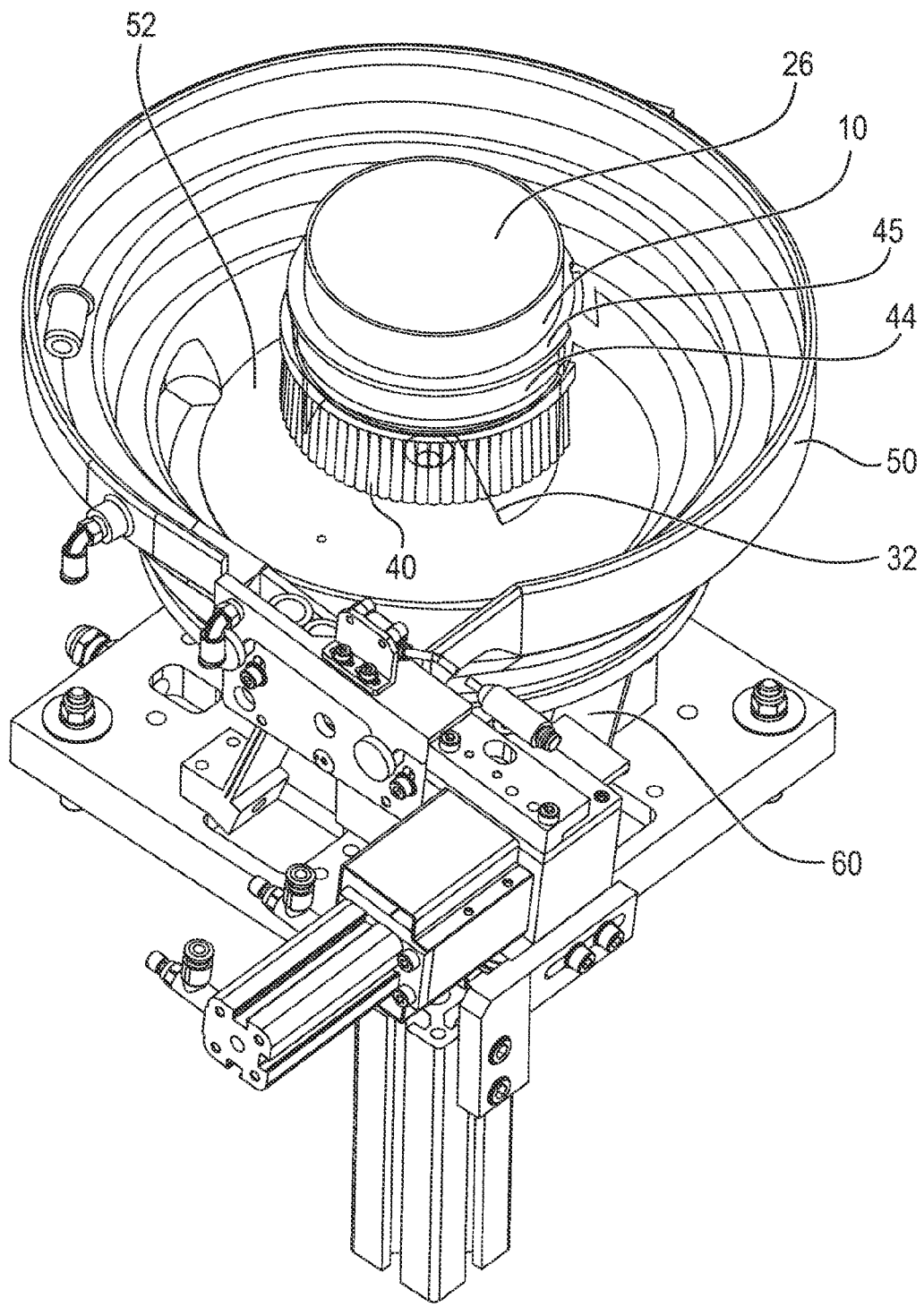
FIG. 2 an enlarged view of individual components of the embodiment of the supply device of FIG. 1, FIG. 3 an explosion view of the first receiving container with a relocatable brush arrangement, FIG. 4 an enlarged view of a design of the transfer zone for elements between the first and the second receiving container, FIG. 5 an enlarged view of a further design of the transfer zone for elements between the first and the second receiving container, FIG. 6 an embodiment of the first receiving container with an inner screw-like transport wall for elements, FIG. 7 an embodiment of the retrofit kit, FIG. 8 a flow chart of a manufacturing method, and FIG. 9 a flow chart of a supply method.

An embodiment of the supply device 1 is illustrated in FIG. 1. The supply device 1 serves for the supplying of elements 3 which are present as a disordered amount. Such elements 3 may be connection elements such as self-piercing rivets, blind rivet nuts, insert nuts, welding auxiliary joining parts, nails, thread bolts or the like.

In order to supply the elements 3 to a processing location, which may be a setting device for blind rivet nuts or self-piercing rivets or bolts, firstly, an initial amount of the elements 3 in disordered form, i.e. as bulk goods, is provided. The initial amount of the elements 3 guarantees that a sufficient number of elements 3 for, for example, a production cycle and the number of connections or joining locations to be established therein is present.

The supply device 1 comprises a first receiving container 10 in which a disordered number of elements 3, which may be as bulk goods, is received. The receiving container 10 according to FIG. 1 consists of a cylindrical hollow body with a circumferential coat-like or shell-like first outer wall 12. The circumferential outer wall 12 includes a first receiving volume 14 which in the application case is partly or completely filled with an amount of disordered elements 3 (not shown), which may be blind rivet nuts.

While FIGS. 1 to 5 show a cylindrical receiving container 10, alternative shapes of the first receiving container 10 may be used. A prerequisite for the alternative shapes is the provision of the first receiving volume 14 in the inside of the first receiving container 10. The first receiving container 10 may be provided with a cuboid form having a square or a rectangular base area (see 10') or as a prism with a pentagon (see 10") or a hexagon base area (see 10'''). Further alternative shapes of the first receiving container 10 are a pyramid cone 10'''' or a truncated cone 10''''' (see FIG. 3).

For the further explanation of the constructive features of the first receiving container 10 to 10''''', reference is made to the cylindrically shaped first receiving container 10 of the figures number 1 to 5. The constructive and functional features which are realized based on this example apply analogously to the differently shaped first receiving containers 10' to 10''''', too.

The cylindrically shaped first receiving container 10 is arranged in a fixed manner in the space by means of a frame construction 20—see the dotdashed lines in FIG. 1. The frame construction 20 guarantees that the plurality of elements 3 which are present in the receiving volume 14, are moved into the direction of an outlet opening 16 of the first receiving container 10, such as by gravity, only, i.e. gravity-driven.

The outlet opening 16 of the first receiving container 10 may be arranged opposite a second receiving container 50, opposite the bottom 52 and/or an inner wall 51 of the second receiving container 50.

Figure 4:
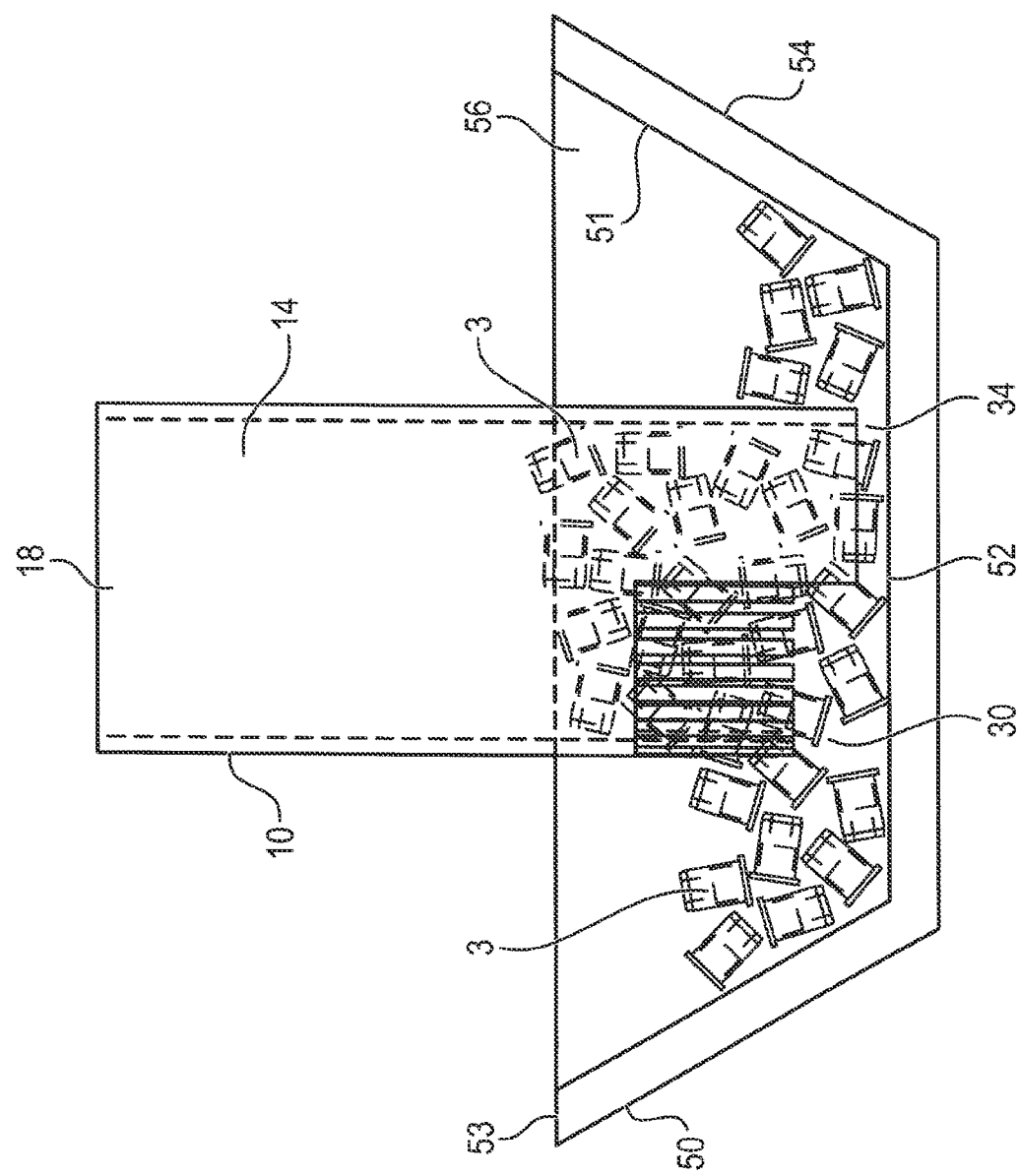

Provided that the first receiving container 10 has a cylindrical form, the outlet opening 16 is formed by an open face side which faces the second receiving container 50. The same applies to alternative forms of the first receiving container 10; 10'; 10''; 10'''; 10'''' and 10''''', as is illustrated in FIG. 4. Accordingly, the alternative first receiving containers 10 to 10''''' have an approximately round outlet opening 16, a quadrangular outlet opening 16', a pentagonal outlet opening 16'', a hexagonal outlet opening 16''', a round outlet opening 16'''' and a pentagonal outlet opening 16''.

Opposite to the outlet opening 16 to 16''''', an inlet opening 18 to 18''''' is provided for each case. It has a shape corresponding to the form of the first receiving container 10, as can for example be seen in FIG. 3.

According to a further design, the first receiving container 10 to 10''''' provides a sufficiently big first receiving volume 14 to 14''''' for receiving a plurality of elements 3. In order to enlarge the receiving volume 14 to 14''''' so that a flexible adaptation to, for example, production requirements, is possible, a bunker 22 is provided.

The bunker 22 constitutes a storage volume 24 of any desired shape—in the present case a cuboid shape. Further elements 3 are receivable in the storage volume 24 which are transferable via a bunker outlet 26 to the first receiving container 10.

The bunker outlet 26, which may be closable manually or automatically, is provided in a bunker bottom 28. The bunker bottom 28 is shaped in an inclined or steep manner into the direction of the bunker outlet 26. By that, the gravity-driven movement of the elements 3 to the bunker outlet 26 is supported. In this connection, A drive of the elements 3 into the direction of the bunker outlet 26 may be provided within the bunker 22.

The bunker 22 is fastened at the frame construction 20 and thus decoupled in terms of movement from the second receiving container 50. According to a further design of the supply device 1, the first receiving container 10 is arranged in a fixed manner via the bunker 22 at the frame construction 20. According to the above alternative, the first receiving container 10 is fastened directly at the frame construction 22 and thus decoupled from a movement of the second receiving container 50.

In the first receiving container 10, a second receiving container 50 is arranged into the direction of the gravity of the elements 3. This second receiving container defines a second receiving volume 56 by a circumferential wall 54 and a bottom 52. The second receiving container 50 is configured bowl-shaped so that the first receiving container 10 is at least partially arranged in the second receiving volume 56 with its first receiving volume 14. For this purpose, the second receiving volume 56 may be defined by the bottom 52, the circumferential wall 54 and its upper edge 53.

According to a further design, the second receiving container 50 is a known vibration feeder, vibration spiral feeder or oscillation feeder. An oscillation feeder is a mechanical feeding device for bulk goods with which, the medium to be transported may be moved by means of linear oscillations or vibrations. Such arrangements are for example described in DE 100 26 765 A1 and DE 100 29 836 C2.

The outlet opening 16 to 16'''' of the first receiving container 10 to 10'''' is arranged within the second receiving volume 56 at a distance and adjacent to the bottom 52. Due to this arrangement, a transfer zone of the elements 3 arises which are transferred from the first receiving volume 14 to 14'''' of the first receiving container 10 to 10'''' into the second receiving volume 56 of the second receiving container 50. For this purpose, the first receiving container 10 to 10'''' is fixedly arranged in the frame construction 20 so that different configurations of the transfer zone 30; 30' are present. The configuration of the transfer zone 30; 30' should guarantee that, supported by oscillations or vibrations of the vibration feeder in form of the second receiving container 50, the elements 3 may be discharged from the first receiving container 10 at a certain rate, i.e. number per time unit, into the vibration feeder 50. This rate guarantees that an attached processing device, for example a setting device for blind rivet nuts, is supplied reliably.

According to a first design (see FIG. 4), the outlet opening 16 is supplemented by a lateral cutout 32. The size of the lateral cutout 32 can be chosen so that only a certain number of elements 3 is able to proceed from the first receiving volume 14 into the vibration feeder 50. Therefore, the lateral cutout 32 may extend over an angle range from $90°≤α≤180°$ with respect to the central longitudinal axis M of the first receiving container 10.

In the same way, adjacent to the outlet opening 16, a plurality of lateral cutouts 32 which are arranged in a distributed manner may be provided.

Figure 3:
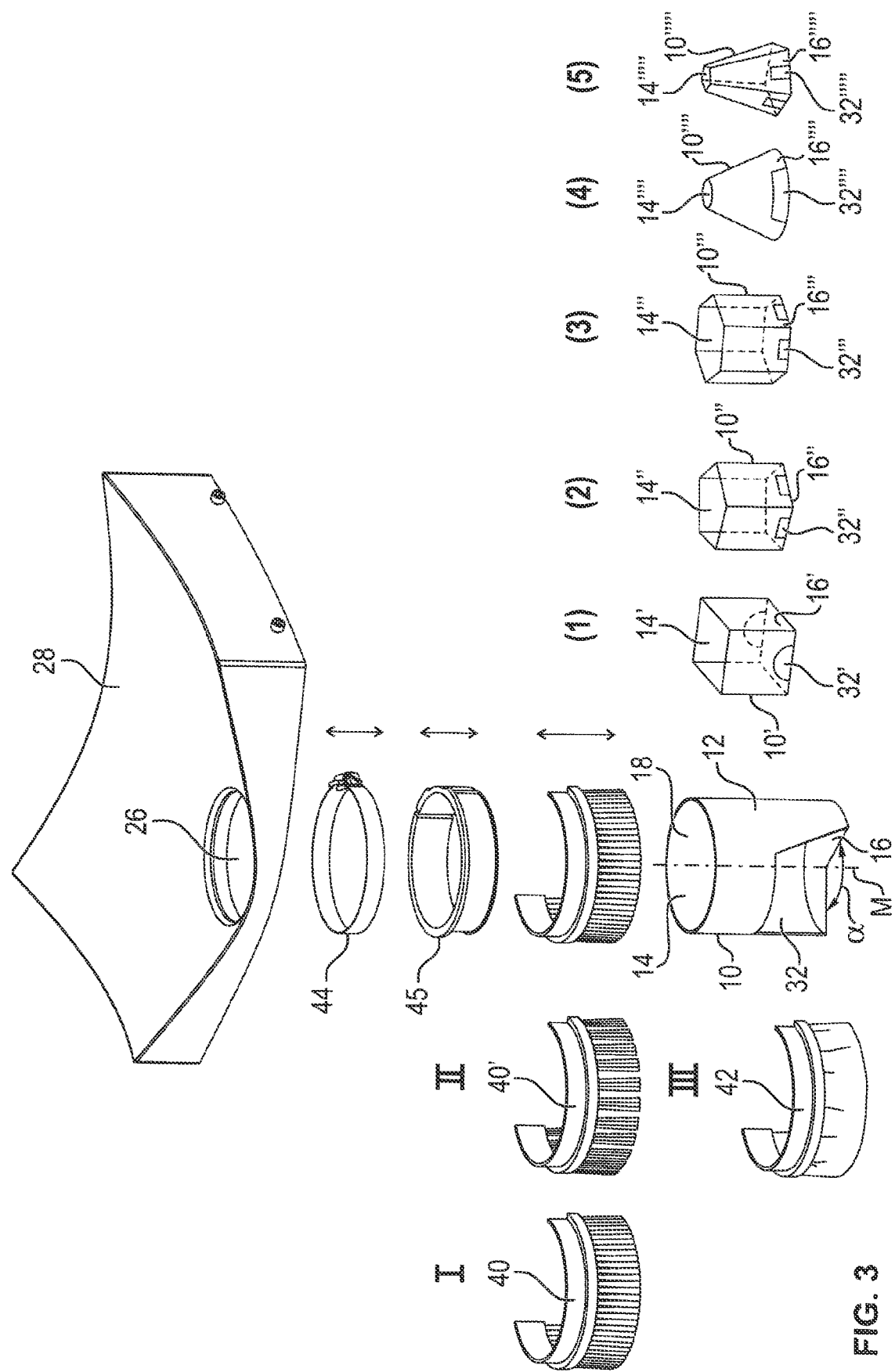

Based on the different designs of the first receiving container 10 to 10'''', FIG. 3 illustrates how further lateral cutouts 32' can be arranged, formed and arranged in a distributed manner on the first receiving container 10. Thus, one or more lateral cutouts 32' may be positioned at one or more lateral faces of the first receiving container 10 to 10''''.

This arrangement of the lateral cutouts 32' is chosen such that the elements 3 are released to the second receiving container 50 in certain areas. The size of the lateral cutout 32 may regulate the rate and direction of the elements 3 passing the transfer zone 30.

According to a further design, the at least one lateral outlet 32 is blocked by a flexible retention device, in particular a brush arrangement 40, a flexible hose end or a flexible curtain. In the following, the features of the flexible retention device are described based on the flexible brush arrangement 40. The brush arrangement 40 consists of a plurality of bristles running parallel or in an inclined manner to each other, wherein the bristles close the lateral cutout 32; 32' at least partly, similar to a curtain. For this purpose, the bristles are provided flexible, so that the elements 3 which pass the transfer zone 30 can push the bristles to the side in order to pass. For this purpose, the brush arrangement 40 may consist of a flexible plastic, rubber or gum or a similar material.

In the embodiments 40 and 40' of the brush arrangement in FIG. 3, the bristles have a different thickness and associated flexibility. The embodiment at reference numeral 42 shows an arrangement which comprises a flexible curtain or a similar construction instead of bristles. Similar to the bristles, this curtain also stops the elements 3 up to a certain degree, until the elements 3 can push the bristles or the curtain to the side for a passing of the transfer zone 30.

The brush arrangement 40; 40' or the curtain 42 may be fastened at the first receiving container 10 to 10'''' with a clamp 44 and a ring 45. It is to be understood that in terms of their form, the ring 45 and the clamp 44 are adapted or adaptable to the respective outer contour of the first receiving container 10 to 10''''.

With the help of the clamp 44, it may be guaranteed that the brush arrangement 40; 40'; 42 can be fastened at different axial positions parallel to the longitudinal axis M of the first receiving container 10 to 10''''. Accordingly, the size of a covering of the lateral cutout 32 or the lateral cutouts can also be adjusted via the brush arrangement by means of a specific axial positioning of the brush arrangement 40; 40'; 42. The arrows in FIG. 3 show the axial adjustability of the clamp 44 and at least of the brush arrangement 40: 40'; 42.

The first receiving container 10 is spaced from the inner wall 52 of the second receiving container 50 with its lower edge or outlet opening 16, respectively, such, that the transfer zone 30 is formed by the at least one lateral outlet 32 to 32'''', only. Accordingly, A gap 34 between the first receiving container 10 to 10'''' and the inner wall 52 may be predefined so small that no element 3 can pass this gap 34 (see FIG. 4).

According to a further embodiment, the first receiving container 100 (see FIG. 5) precisely does not have any lateral cutout 32. Rather, the first receiving container 100 is spaced from the bottom 52 parallel into the direction of its longitudinal axis as far that at least one layer of elements 3 at the inner wall 52 can pass the gap 34' (see FIG. 5). Thus, the transfer zone 30' may be formed by the gap 34'.

In the above-described embodiments, the first receiving volume 14 to 14'''' is limited by the bottom 52 and the inner wall 51 of the second receiving container 50. Accordingly, the bottom 52 of a vibration feeder may limit the first receiving volume 14 to 14''''. In this way, the elements 3 cannot pass the transfer zone 30; 30' due to their gravity and the resulting dynamic pressure alone. The energy which is necessary for the passing of the transfer zone 30; 30' may be supplied by the oscillations or vibrations, which may be linear oscillations or vibrations, of the inner wall 52 of the vibration feeder to the elements 3. The second receiving container 50 may be formed by the vibration feeder (see above). Compared with the elements 3 which are resting in the first receiving volume 14 to 14'''' at first, the vibration feeder moves in an oscillating or vibrating way, in particular, the bottom 52 oscillates or vibrates, which then causes the elements 3 to be transferred from the first receiving volume 14 to 14'''' through the transfer zone 30; 30' into the second receiving volume 56 in the vibration feeder 50.

In this way, the bottom 52 of the second receiving container 50 first of all limits the first receiving volume 14 to 14'''' with the stored elements 3 against the gravity of the elements 3. As soon as the bottom 52, which limits the first receiving volume 14 to 14'''', is oscillated or vibrated which may be in combination with the adjacent inner wall 51, these oscillations or vibrations are transmitted to the elements 3 and cause and support their transfer from the first receiving volume 14 to 14'''' into the second receiving volume 56. At the same time, the second receiving container 50 may oscillate or vibrate in a transverse or circumferential manner to its central longitudinal axis.

In this connection, oscillations or vibrations in other oscillation planes and oscillation directions are preferred as long as they cause and support a movement of the elements 3 out of the first receiving volume 14 to 14'''' into the second receiving volume 56.

Accordingly, instead of the vibration feeder, the second receiving container 50 is provided by means of a bowl-like container with a driven centrifugal mass. The centrifugal mass may consist of a rotating mass which is arranged asymmetrically to the rotation axis of the rotating mass.

Figure 5:
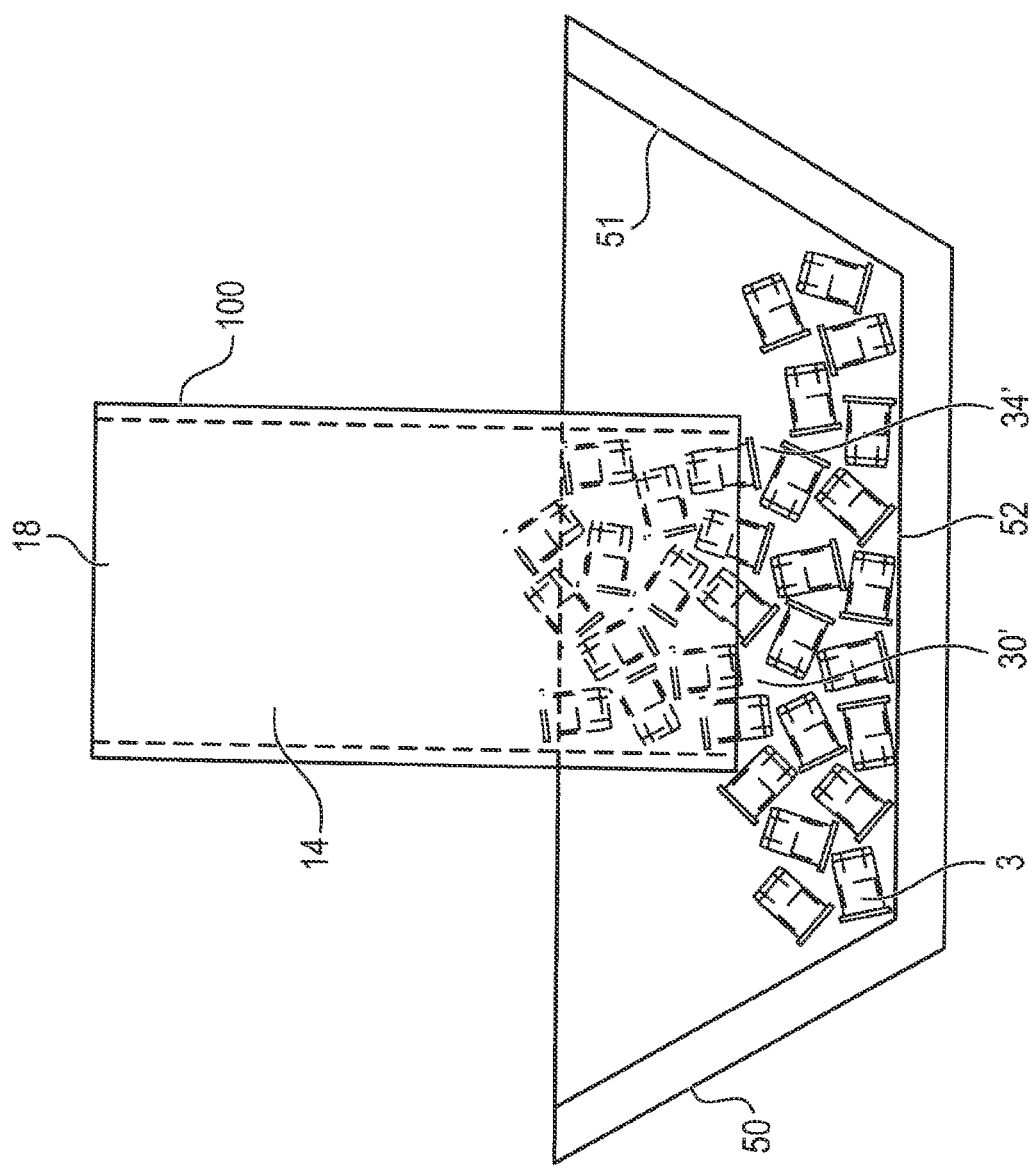

According to the embodiments of FIGS. 3 to 5, the first receiving container 10 to 10'''' provides the continuous first receiving volume 14 to 14''''. Accordingly, the elements 3 generate a dynamic pressure at the limiting bottom 52 of the second receiving container 50 depending on the filling level of the first receiving volume 14 to 14'''', with the dynamic pressure being determined by the gravity of the elements 3 in the first receiving volume 14 to 14''''.

Figure 6:
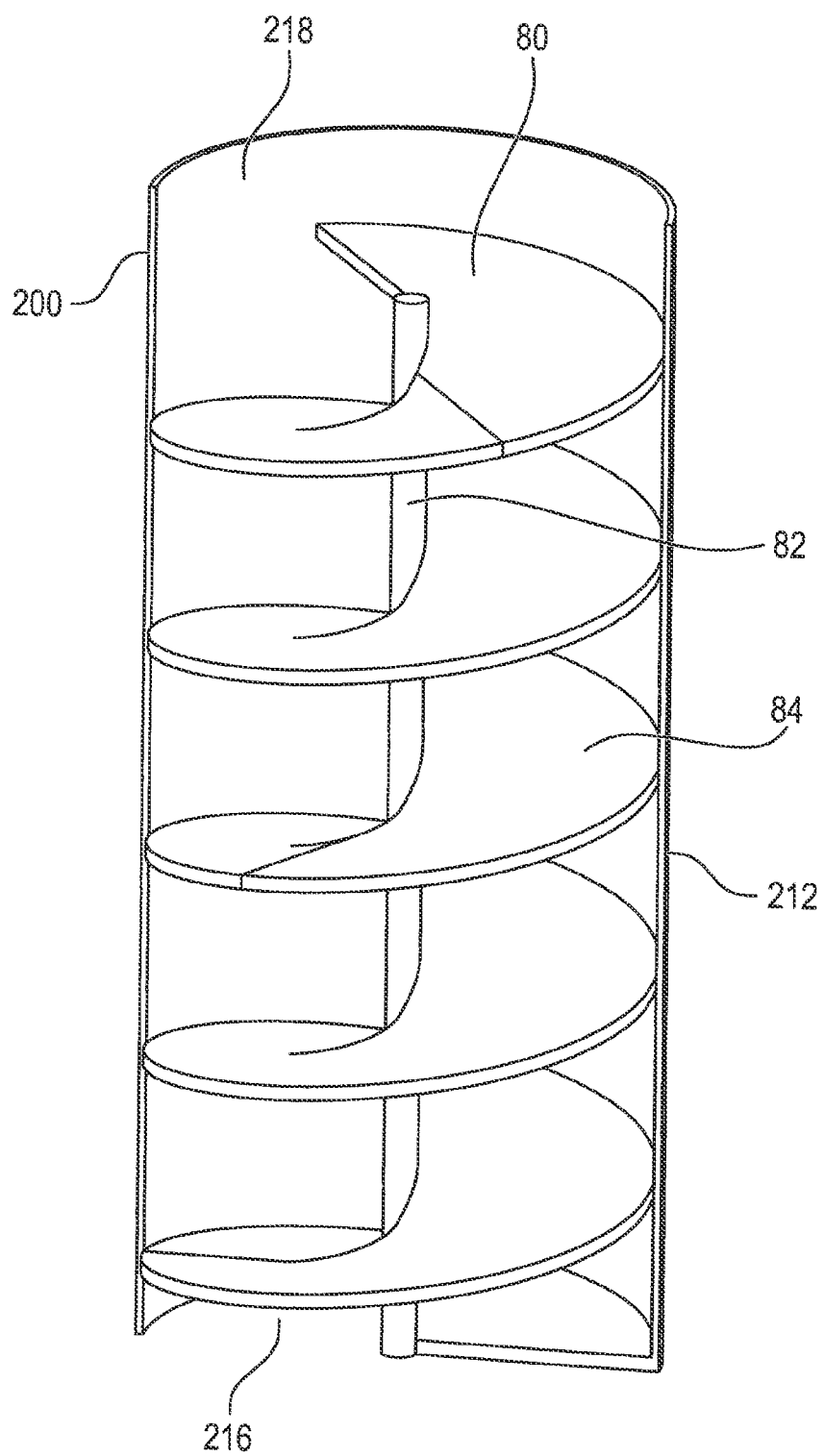

In order to control the dynamic pressure which is applied by the elements 3 onto the bottom 52 and/or the inner wall 51, a screw spiral 80 may be arranged within the first receiving container 200 as illustrated in FIG. 6. The first receiving container 200 may have a hollow-cylindrical form with an outer wall 212, a first supply opening 218 and a first outlet opening 216.

The screw spiral 80 comprises a radial wall 84 which circulates the central axis 82 of the first receiving container 200 spirally. The radial wall 48 begins at the supply opening 218 and ends at the outlet opening 216. As soon as the elements 3 (not shown) are supplied as bulk goods to the first receiving container 200 directly or via the upstream bunker 22, the elements 3 move on the radial wall 84 into the direction of the outlet opening 216.

According to a further embodiment, the first receiving container 200 is, according to FIG. 5, arranged above the inner wall 52 of the second receiving container 50. By that, the transfer zone is formed by the transfer gap 30' between the edge 217 adjacent to the outlet opening 216 and the inner wall 52. The transfer gap 30' may be big enough so that at least one layer of elements 3 on the bottom 52 can pass the transfer gap 30' and thus the transfer zone from the first into the second receiving volume 50.

According to a further design, a lateral cutout with a brush arrangement (not shown) is provided adjacent to the first outlet opening 216 in order to control the exiting of elements 3, 3 from the first receiving container 200.

It also applies to the design of the first receiving container 200 according to FIG. 6 that it is arranged in the supply device 1 in a decoupled way from the second receiving container 50 in terms of movement. The frame construction 20 according to FIG. 1 holds the first receiving container 200. For this purpose, the frame construction is supported by the bottom in a stable way independent of the second receiving container 50 or is suspended in a suitable manner. Furthermore, the first receiving container 200 may be combined with a bunker 22, too, in order to be able to provide an additional volume 24 of elements 3.

Figure 7:
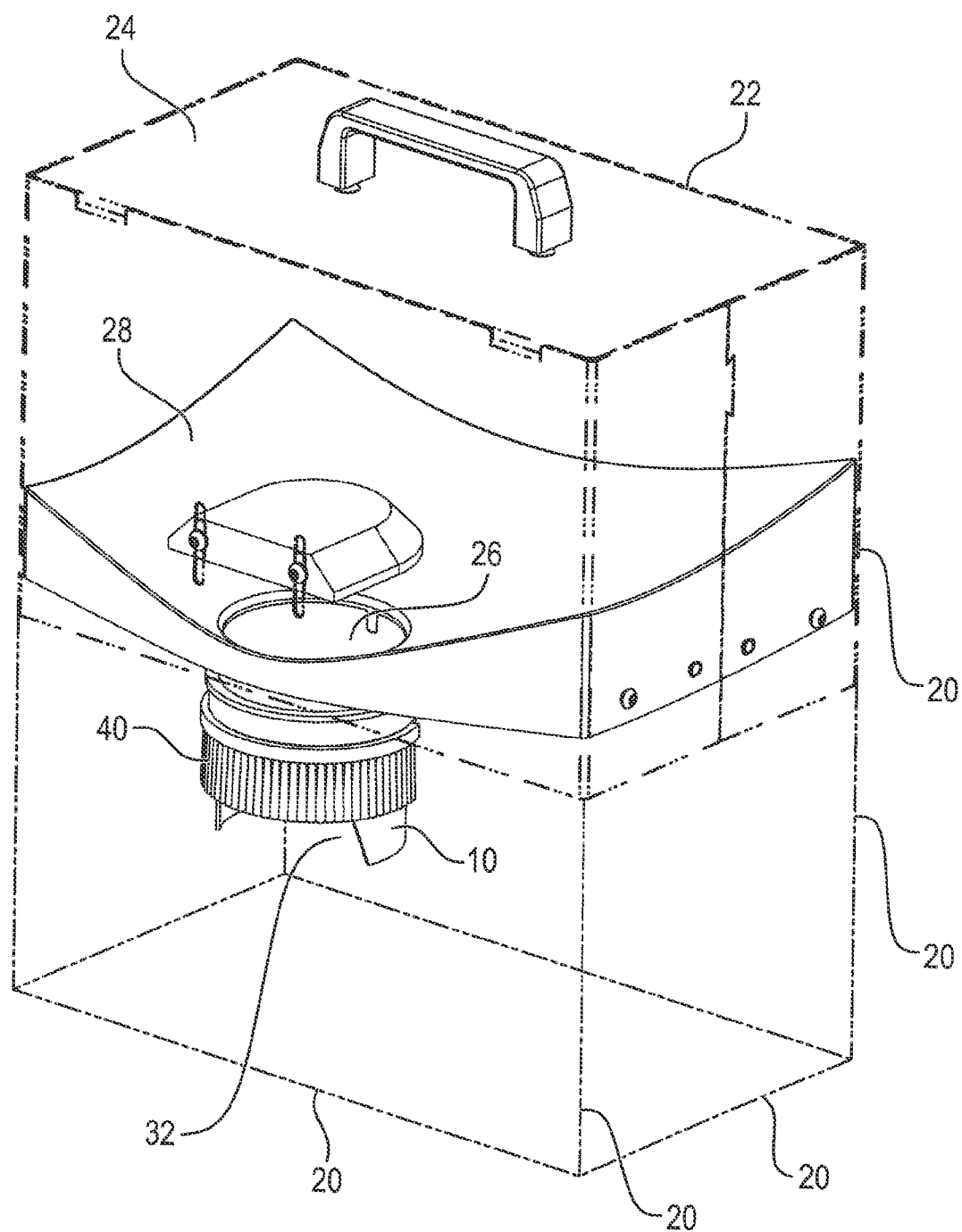
Figure 8:
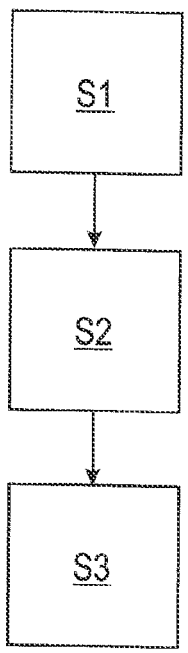
Figure 9:
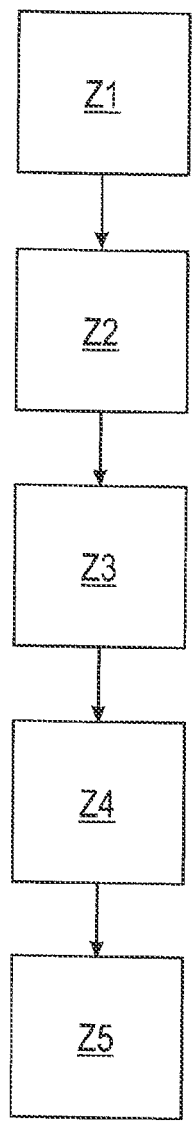

Furthermore, the present disclosure describes a retrofit kit for a known vibration or oscillation feeder, as is for example shown in FIG. 7.

While the oscillation feeder forms the second receiving volume 50, the first receiving container 10 to 10'''', 200 is arranged in a movement-decoupled way with respect to the oscillation feeder with the help of a frame construction 20 above the oscillation feeder. For this purpose, the frame construction 20 is supported by a firm base independent of the oscillation feeder or is suspended accordingly, so that the movement of the oscillation feeder is not transferred onto the first receiving container. Furthermore, the first receiving container 10 to 10'''', 200 may be fastened together with the bunker 22 in the frame construction 20.

The retrofit kit realizes the same constructive and functional properties with a known vibration feeder as they were described above with reference to the different embodiments.

A manufacturing method for the above-described supply device 1 is also disclosed. In the course of the manufacturing method, a known vibration feeder or oscillation feeder is provided in a first step S1. This known device is characterized by a bowl-shaped receiving container 50. The receiving container 50 can be put into oscillations with the help of a motor drive. These oscillations of the receiving container 50 result in elements 3 which are present in the receiving container 50 being moved radially outwardly in order to transfer them individually and/or into a specific orientation out of the second receiving container 50.

A frame construction 20 is provided in a second manufacturing step S2. The frame construction 20 is adapted so as to arrange and fasten the first receiving container 10 to 10'''', 200 above the receiving container 50 of the oscillation feeder and at least partly within the second receiving volume 56 of the oscillation feeder in a third manufacturing step S3. In this connection, the first receiving container 10 to 10'''', 200 is fastened such that according to the above description of the embodiment of the supply device 1, it is firmly arranged adjacent to the inner wall 52 as well as in a movement-decoupled way with respect to the oscillation feeder, i.e. at rest, in the frame construction 20.

For this manufacturing method, a new vibration feeder may be combined with the first receiving container 10 to 10''''; 200 or an existing vibration feeder is further equipped with the retrofit kit.

In order to be able to provide a sufficient number of elements 3, the first receiving container 10 to 10''''; 200 may be combined with a bunker 22 (see above). The bunker 22 may be fastened in the frame construction 20.

Moreover, a supply method for a plurality of elements 3 with the above-described supply device 1 is disclosed. In a first step Z1, the plurality of disordered elements 3 is supplied to the first receiving volume 14 to 14''''; 214 in the first receiving container 10 to 10''''; 200. After supplying the elements 3 to the first receiving container 10 to 10''''; 200, the elements 3 abut the inner wall 52 of the second receiving container 50 or are accumulated there. Because due to the gravity of the elements 3 within the first receiving volume 14 to 14'''' alone, the elements 3 are not capable of passing the transfer zone 30; 30' into the second receiving volume 56.

In order to supply the elements 3 which are stored and accumulated or built-up in the first receiving container 10 to 10''''; 200 with the necessary movement energy for the passing of the transfer zone 30; 30', the inner wall 52 of the second receiving container 30 is moved with respect to the first receiving container 10 to 10''''; 200. This movement may be provided by oscillations of the oscillation feeder.

With the help of the movement energy in form of oscillations transferred by the oscillation feeder onto the elements 3 in the first receiving container 10 to 10''''; 200, the elements 3 are put in the position to pass the transfer zone 30; 30'. Accordingly, in step Z5, the disordered elements 3 are discharged from the first transfer container 10 to 10''''; 200 into the second receiving volume 56 of the second receiving container 50.

In order to correspondingly adjust the rate of elements 3 which are discharged through the transfer zone out of the first receiving volume 14 to 14'''', 214 into the second receiving volume 56, the brush arrangement 40 may be relocated in its axial position with respect to the longitudinal axis of the first receiving container 10 to 10''''; 200 in a further supply step Z3. In this way, it is possible to change the size of the transfer zone 30 with the help of the axial position of the brush arrangement 40 in combination with the lateral cutout 32 to 32'''' such that a changeable rate of elements 3 passes the transfer zone 30; 30'. Because by the relocating or displacing of the brush arrangement 40 regarding its axial position with respect to the longitudinal axis of the first receiving container 10 to 10''''; 200, the covering of the lateral cutout 32 to 32'''' by the brush arrangement 40 is changed and in this way, the effect of the bristles on the entering elements 3 and/or the covering of the lateral cutout 32 to 32'''' by the brush arrangement 40 is changed. Accordingly, more or less elements 3 can pass the transfer zone 30; 30' per time unit.

The first receiving container 100 may be dislocated with respect to the second inner wall 52 such (step Z4) that the transfer gap 30' between the first and the second receiving container is changed in its width. In this way, the number of elements 3 which can pass the transfer zone 30' per time unit can also be adjusted.

The invention claimed is:

1. A supply device with which elements in disordered form are suppliable to a second receiving volume, the device having the following features:
    a first receiving container which has a first circumferential outer wall and defines a first receiving volume for the disordered elements which is fillable via a first supply opening and drainable via a first outlet opening,
    a second receiving container which has an inner wall and defines the second receiving volume, wherein
        the first receiving container with the first receiving volume is arranged at least partly within the second receiving volume,
        a bottom of the second receiving container is positioned at a distance to the first outlet opening such that the first receiving volume is defined and limited by the first circumferential outer wall of the first receiving container and the inner wall of the second receiving container, and a transfer zone is present for disordered elements from the first receiving container into the second receiving container, and wherein
        at least the bottom of the second receiving container with regard to the first receiving container is movable such that the disordered elements are dischargeable from the first receiving volume of the first receiving container into the second receiving volume of the second receiving container by means of the movement of the bottom.

2. The supply device according to claim 1 in which the bottom of the second receiving container is puttable into vibrations by means of a drive in order to discharge the disordered elements out of the first receiving container.

3. The supply device according to claim 2 in which a first circumferential outer wall of the first receiving container includes, adjacent to the outlet opening, a lateral cutout which defines the transfer zone.

4. The supply device according to claim 2 in which a first circumferential outer wall of the first receiving container is arranged approximately circumferentially evenly spaced at the first outlet opening with respect to the bottom and/or to a second inner wall of the second receiving container whereby a transfer gap for disordered elements from the first receiving container into the second receiving container is determined.

5. The supply device according to claim 2 in which the first receiving container has an essentially cylindrical shape and the second receiving container is configured as a vibration feeder or vibration spiral feeder.

6. The supply device according to claim 1 in which a first circumferential outer wall of the first receiving container includes, adjacent to the outlet opening, a lateral cutout which defines the transfer zone.

7. The supply device according to claim 6 in which the bottom of the second receiving container is arranged at such a distance to the outlet opening of the first receiving container that disordered elements are discharged through the lateral cutout, but not through a gap between the first outer wall of the first receiving container and the bottom of the second receiving container.

8. The supply device according to claim 7 in which the lateral cutout encloses an opening angle range from 90° to 180° with respect to a central longitudinal axis of the first receiving container.

9. The supply device according to claim 8 in which the lateral cutout is at least partly blocked by a flexible retention device which causes the disordered elements to be supplied in the transfer zone at a decelerated movement from the first receiving container to the second receiving container.

10. The supply device according to claim 7 in which the lateral cutout is at least partly blocked by a flexible retention device which causes the disordered elements to be supplied in the transfer zone at a decelerated movement from the first receiving container to the second receiving container.

11. The supply device according to claim 6 in which the lateral cutout is at least partly blocked by a flexible retention device which causes the disordered elements to be supplied in the transfer zone at a decelerated movement from the first receiving container to the second receiving container.

12. The supply device according to claim 11 in which the flexible retention device is arranged in an adjustable manner regarding its position with respect to the lateral cutout of the first receiving container in order to change a size of a covering of the lateral cutout by the flexible retention device.

13. The supply device according to claim 6 in which the first receiving container has an essentially cylindrical shape and the second receiving container is configured as a vibration feeder or vibration spiral feeder.

14. The supply device according to claim 1 in which a first circumferential outer wall of the first receiving container is arranged approximately circumferentially evenly spaced at the first outlet opening with respect to the bottom and/or to a second inner wall of the second receiving container whereby a transfer gap for disordered elements from the first receiving container into the second receiving container is determined.

15. The supply device according to claim 1 in which the first receiving container has an essentially cylindrical shape and the second receiving container is configured as a vibration feeder or vibration spiral feeder.

16. The supply device according to claim 15 in which the first receiving container is arranged coaxially to the second receiving container.

17. A manufacturing method of a supply device according to claim 1 which includes the following steps:
    a. providing (S1) a vibration feeder,
    b. providing (S2) a frame construction at least partly above the vibration feeder and c. fastening (S3) a first receiving container at the frame construction, the first receiving container defining a first receiving volume for the disordered elements by a first circumferential outer wall, the first receiving volume being fillable via a first supply opening in the first receiving container and being drainable via a first outlet opening in the first receiving container into a second receiving container which has an inner wall and defines the second receiving volume, wherein the first receiving container with the first receiving volume is arranged at least partly within the second receiving volume, a bottom of the second receiving container is positioned at a distance to the first outlet opening such that the first receiving volume is defined and limited by the first circumferential outer wall of the first receiving container and the inner wall of the second receiving container, so that a transfer zone for disordered elements from the first receiving container into the second receiving container is present and at least the bottom of the second receiving container with regard to the first receiving container is movable such that the disordered elements are dischargeable from the first receiving volume of the first receiving container into the second receiving volume of the second receiving container by the movement of the bottom.

18. A supply method for a plurality of disordered elements using a supply device according to claim 1 which includes the following steps:
   a. supplying (Z1) a plurality of disordered elements into the first receiving volume of the first receiving container,
   b. moving (Z2) the second inner wall of the second receiving container with respect to the first receiving container, and
   c. discharging (Z5) of disordered elements out of the first receiving container through the transfer zone into the second receiving volume of the second receiving container.

19. The supply method according to claim 18 with the further step:
   relocating (Z3) a brush arrangement which closes at least partly a lateral cutout of the first receiving container.

20. The supply method according to claim 19 with the further step:
   relocating (Z4) the first receiving container with respect to the second inner wall so that a transfer gap is defined between the first and the second receiving container.

* * * * *